(12) United States Patent
Novellini et al.

(10) Patent No.: US 10,832,757 B1
(45) Date of Patent: Nov. 10, 2020

(54) RECEIVER FOR AND METHOD OF IMPLEMENTING A RECEIVER IN AN INTEGRATED CIRCUIT DEVICE

(71) Applicant: Xilinx, Inc., San Jose, CA (US)

(72) Inventors: Paolo Novellini, Gorgonzola (IT); Giovanni Guasti, Cornaredo (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/279,851

(22) Filed: Feb. 19, 2019

(51) Int. Cl.
  *G11C 8/00* (2006.01)
  *G11C 11/4076* (2006.01)
  *G11C 7/22* (2006.01)
  *G06F 1/10* (2006.01)

(52) U.S. Cl.
  CPC ............ *G11C 11/4076* (2013.01); *G06F 1/10* (2013.01); *G11C 7/222* (2013.01); *G11C 2207/22* (2013.01)

(58) Field of Classification Search
  CPC . G11C 11/4076; G11C 2207/22; G11C 7/222; G06F 1/10
  See application file for complete search history.

(56) References Cited

U.S. PATENT DOCUMENTS

| | | | |
|---|---|---|---|
| 7,580,319 B2 * | 8/2009 | Kim | G11C 7/1039 365/230.03 |
| 7,590,448 B2 | 9/2009 | de Vries | |
| 8,386,828 B1 | 2/2013 | Ambatipudi | |
| 9,130,807 B1 | 9/2015 | Novellini | |
| 9,331,724 B2 | 5/2016 | Novellini | |
| 9,872,346 B2 * | 1/2018 | Kurishita | H05B 45/10 |
| 10,033,523 B1 * | 7/2018 | Remla | H04J 3/0682 |
| 10,291,501 B1 * | 5/2019 | Novellini | H03K 19/17744 |

OTHER PUBLICATIONS

U.S. Appl. No. 15/886,688, filed Feb. 1, 2018, Systems for and Methods of Measuring Latency of Data Buffers, San Jose, CA USA.
Xilinx, Inc.,User Guide, UG576(v1.5) UltraScale Architecture GTH Transceiver, pp. 249-263, Jul. 14, 2017, San Jose, CA USA.

* cited by examiner

*Primary Examiner* — Pho M Luu
(74) *Attorney, Agent, or Firm* — John J. King, Law Offices of John J. King

(57) ABSTRACT

A receiver implemented in an integrated circuit device is described. The receiver circuit comprises a first receiver circuit configured to receive first data, wherein the first receiver circuit comprises a first memory element configured to receive the first data in response to a first clock signal; a latency mirror circuit configured to receive second data, wherein the latency mirror circuit comprises a second memory element configured to receive the second data in response to a second clock signal; and a latency control circuit configured to detect a latency in the second data, wherein the latency control circuit adjusts a phase of the first clock signal used to receive the first data in the first receiver circuit.

20 Claims, 7 Drawing Sheets

RECEIVER FOR AND METHOD OF IMPLEMENTING A RECEIVER IN AN INTEGRATED CIRCUIT DEVICE

FIELD OF THE INVENTION

The present invention relates generally to integrated circuit devices, and in particular to a receiver for and a method of implementing a receiver in an integrated circuit device.

BACKGROUND OF THE INVENTION

Data transmission is an important aspect of integrated circuit devices. Many integrated circuit devices include data transceivers that enable the transmission and receipt of data at input/output (I/O) ports. Some data transceiver devices comprise serializer/deserializer (serdes) circuits, where data that is transmitted by a transmitter (TX) of the transceiver of the integrated circuit device is serialized, and serialized data that is received by a receiver (RX) of the transceiver of the integrated circuit device is deserialized to generate parallel data.

In general, when a receiver serdes comes out of reset for example, the latency is known with limited precision due to the presence of a memory element of the receiver, such as a first-in, first-out (FIFO) circuit. As a general rule, if the RX FIFO is N bit wide, the receiver will exhibit a maximum of N bits of latency uncertainty. This uncertainty is caused by an unknown phase relationship between the RX FIFO reset signal and the internal clock writing to the FIFO.

Accordingly, there is a need for circuits for and methods of implementing a receiver circuit, and more particularly, implementing a receiver that compensates for the latency in a circuit.

SUMMARY OF THE INVENTION

A receiver implemented in an integrated circuit device is described. The receiver circuit comprises a first receiver circuit configured to receive first data, wherein the first receiver circuit comprises a first memory element configured to receive the first data in response to a first clock signal; a latency mirror circuit configured to receive second data, wherein the latency mirror circuit comprises a second memory element configured to receive the second data in response to a second clock signal; and a latency control circuit configured to detect a latency in the second data, wherein the latency control circuit adjusts a phase of the first clock signal used to receive the first data in the first receiver circuit.

A method of receiving data in an integrated circuit device is described. The method comprises receiving first data in a first receiver circuit, wherein the first receiver circuit comprises a first memory element configured to receive the first data in response to a first clock signal; and receiving second data in a latency mirror circuit, wherein the latency mirror circuit comprises a second memory element configured to receive the second data in response to a second clock signal; detecting a latency in the second data; and adjusting a phase of the first clock signal used to receive the first data in the first receiver circuit.

DETAILED DESCRIPTION OF THE DRAWINGS

The circuits and methods set forth below enable measuring the latency of a serdes receiver during runtime, with sub-UI resolution, where the measurement may be made indirectly. A receiver implemented in an integrated circuit device may comprise a first receiver circuit configured to receive first data that comprises application data and a latency mirror circuit configured to receive second data that comprises other data, which may be arbitrary data. A latency control circuit may be configured to detect a latency in the second data, wherein the latency control circuit may compensate for a latency in the first receiver circuit, such as by adjusting a phase of a clock signal used by the first receiver circuit. The circuit may provide real time adjustments of a clock signal used for receiving the application data, and can compensate for variations in voltage and temperature of the integrated circuit device. Phase interpolators, which are generally not affected by variations in voltage or temperature, may be used. According to some implementations, fill levels of memory elements may be used to detect changes in latency in the latency mirror circuit, where a phase of a clock signal used to receive the first data would be adjusted to compensate for latency in the first receiver based upon the detected latency in the latency mirror circuit.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
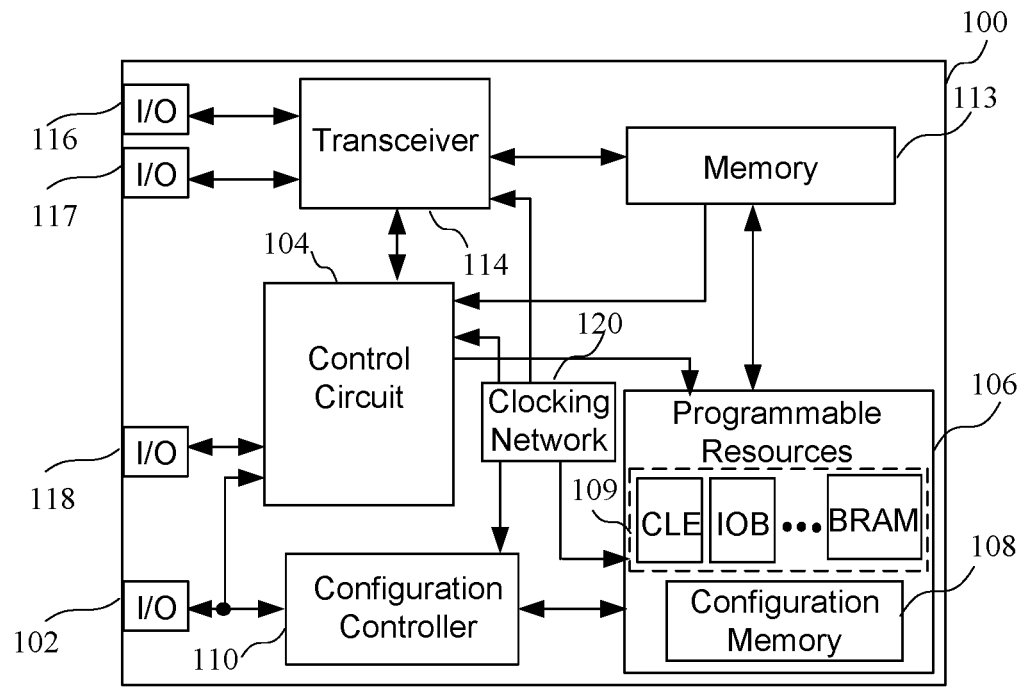
FIG. 1 is a block diagram of an integrated circuit having circuits for transmitting and receiving data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, other circuits could be implemented as an integrated circuit having transceivers.

Figure 2:
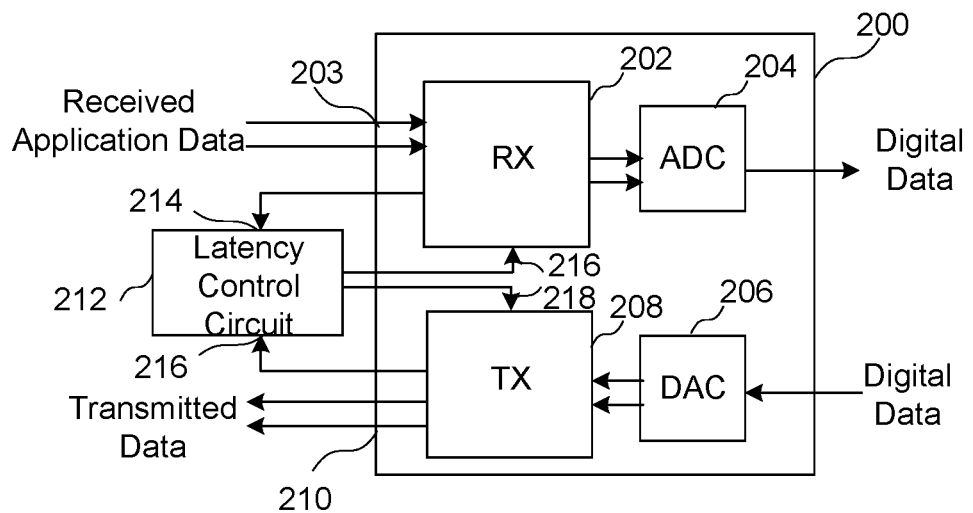
FIG. 2 is a block diagram of a circuit for receiving data in an integrated circuit device.

Turning now to FIG. 2, a block diagram of a circuit for receiving data in an integrated circuit device is shown. More particularly, a transceiver 200, which may be implemented as transceiver 114 of FIG. 1 for example, comprises a receiver 202 configured to receive application data at an input 203. An output of the receiver 202 is coupled to an analog-to-digital converter (ADC) 204, which generates digital data that may be used by the integrated circuit device. The transceiver 200 also comprises a digital-to-analog converter (DAC) 206 that receives digital data, where an output of which is analog data that is provided to a transmitter 208. The transmitter 208 generates an analog signal that is transmitted by the integrated circuit at an output 210. As will be described in more detail below, the received application data could be analog serial data, where the digital data generated by the ADC 204 could be parallel data. The digital data provided to the DAC 206 could be parallel data. The transmitted signal may comprise serial data, and the received application data and the transmitted data may comprise single ended data or differential data.

As will also be described in more detail below, the circuit makes use of 2 devices, such as receivers, for determining latency in receivers of the integrated circuit, and particularly a memory element such as a FIFO of a receiver. According to some implementations, a receiver of a transceiver may be used as the first receiver, a transmitter of the transceiver (or of a different transceiver) may be used as a receiver or other data transmission device for purposes of determining latency of a receiver. Accordingly, information related to the transmission of data by the transmitter 208 may be used to determine latency in the receiver 202, and therefore control a phase of the clock signal used to receive the data using the receiver 202. A latency control circuit 212, is configured to receive information from both the receiver 202 at an input 214 and from the transmitter 208 at an input 216. Control signals for controlling the operation of the receiver 202, such as for controlling a phase of a clock signal used to receive data in the receiver 202, are received at an input 216, while control signals for controlling the operation of the transmitter 208, such as for controlling a phase of a clock signal used to transmit data in the transmitter 202, are received at an input 218. While a transmitter is used by way of example to determine latency, such as latency due to variations in voltage and temperature in the circuit (where the detected latency is used to compensate for latency in the receiver 202), a receiver separate from receiver 202 could be used instead to determine latency, as will be described in more detail below. However, it should be understood that any device that mirrors the latency of a receiver circuit can be used to determine the latency in the receiver circuit.

Figure 3:
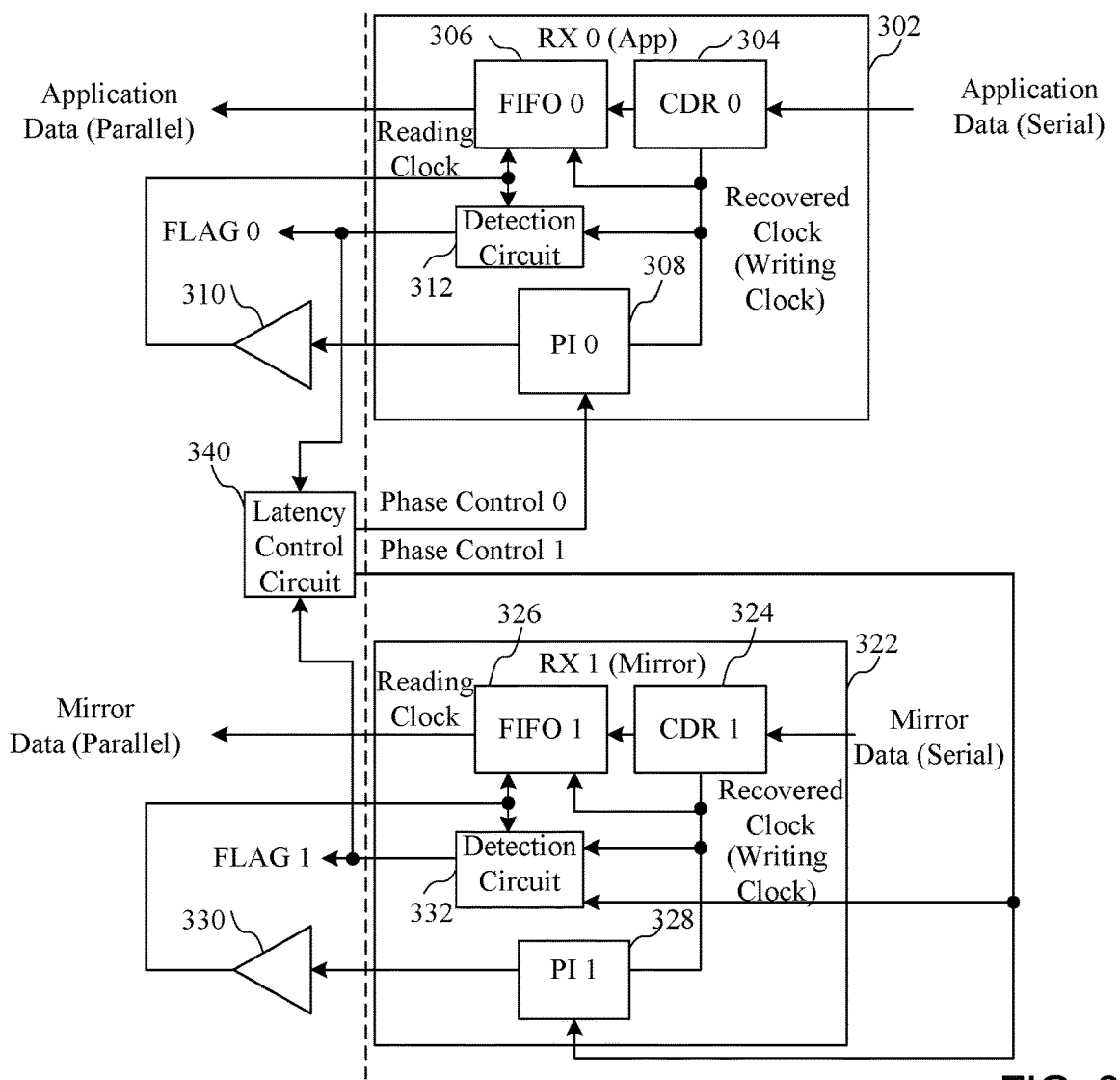
FIG. 3 is another block diagram of a circuit for receiving data in an integrated circuit device.

Turning now to FIG. 3, another block diagram of a circuit for receiving data in an integrated circuit device is shown. The circuit of FIG. 3 includes a first receiver for receiving data, described by way of example as application data that is desired to be transmitted and received in a system, and a latency mirror circuit configured to receive mirror data, which may be the same as the application data or may be arbitrary data, that is used to determine the latency in receivers of the integrated circuit, including the receiver that receives that application data. A first receiver 302 adapted to receive the application data comprises a clock and data recovery (CDR) circuit 304, an output of which is coupled to a memory element 306, shown here by way of example as a first-in, first-out (FIFO) memory element, and a delay element 308, shown here by way of example as a phase interpolator (PI). In addition to the application data that is provided to the memory element 306, a recovered clock signal is coupled to the delay element 308. While the delay element 308 may comprise a series of delay elements that can be controlled to implement a desired delay, a phase interpolator may be less susceptible to variations in voltage and temperature of the integrated circuit device. As will be described in more detail below, the delay element is used to control a clock signal to the memory element 308 to adjust for a detected latency in another receiver circuit, such as the latency mirror circuit 322. An output of the delay element is provided to a buffer 310, an output of which is provided to the memory element 306 and a detection circuit 312.

The detection circuit 312 is configured to receive both the recovered clock and the phase of the clock signal generated by the phase interpolator 308 as provided by the buffer 310, wherein the detection circuit determines a change in latency of the received signal, which may be due for example to changes in voltage or temperature of the integrated circuit device over time for example. According to one implementation, the detection circuit 312 may generate a flag that is used determine latency, where the flag may indicate a fill level of the memory element for example, as will be described in more detail below.

The circuit of FIG. 3 also comprises a latency mirror circuit 322 that is used to determine a latency of the receiver circuit 302, and more particularly run-time latency, such as latency that may result from variations in a voltage or temperature of the receiver circuits. The latency mirror circuit 322 is adapted to receive data, and comprises a clock and data recovery (CDR) circuit 324, and output of which is coupled to a memory element 326, also shown here by way of example as a first-in, first-out (FIFO) memory element, and a delay element 328, shown here by way of example as a phase interpolator (PI). The data, shown as mirror data, may be arbitrary data and can be any data, including a copy (i.e. of the application data) for convenience. As will be described in more detail below, it is not necessary that the data provided to the CDR circuit 324 have the same frequency as the application data received by the receiver circuit 302. In addition to the data that is provided to the memory element 326, a recovered clock signal is coupled to the delay element 328. The delay element 328 may also comprise a series of delay elements that can be controlled to implement a desired delay or a phase interpolator as described above. As will be described in more detail below, the delay element is used to control a clock signal to the memory element 326 to enable detecting latency in the receiver circuit. An output of the delay element is provided to a buffer 330, an output of which is provided to the memory element 326 and a detection circuit 332.

The detection circuit 332 is configured to receive both the recovered clock and the phase of the clock signal generated by the phase interpolator 328, wherein the detection circuit 332 is also used to determine a change in latency of the received signal, which may be due for example to changes in voltage or temperature of the integrated circuit device. According to one implementation, the detection circuit 332 may generate a flag that is used determine latency, where the flag may indicate a fill level of the memory element for example. More particularly, a latency control circuit 340 is configured to receive the flag generated by the detection circuit 332. The flag may be used to represent a half-full state of the memory element 306, or any other state, such as almost full or almost empty for example, where changes in the full state and the recovered clock signals can be used by the latency control circuit to determine a change in latency in the receiver as described in reference to FIG. 6.

Based upon a latency determined by the latency control circuit 340, a phase control signal (Phase Control 0) generated by the latency control circuit 340 is coupled to control the phase of the clock signal coupled to the memory element 306. The phase control signal (Phase Control 1) may also be generated by the latency control circuit 340 to adjust the phase of the phase interpolator 328 to determine how to control the phase of the clock signal coupled to the memory element 306 that receives the application data. That is, because changes in voltage or temperature that affect the latency of the latency mirror circuit 322 would affect the latency of receiver 302 in the same way, any determined change in the latency of the latency mirror circuit 322 that would require compensation by a variation of the phase of the recovered clock signal could also be used to change the phase of the clock signal used to receive the application data by receiver 302.

It should be noted that the latency control circuit 340 could be used to determine a change in the phase of the clock signal coupled to the memory element 306. That is, while the frequency of the clock signal used to receive the mirror data by latency mirror 322 may be different that the clock signal used to receive the application data by receive 302, the variation in the phase of the recovered clock signal determined by latency control circuit 340, using for example the flag generated by the latency mirror circuit 332, can be used to determine an appropriate change in phase of a clock signal coupled to the memory element 306 of the receiver to compensate for a latency variation of the receiver 302 caused by changes in voltage or temperature.

Figure 5:
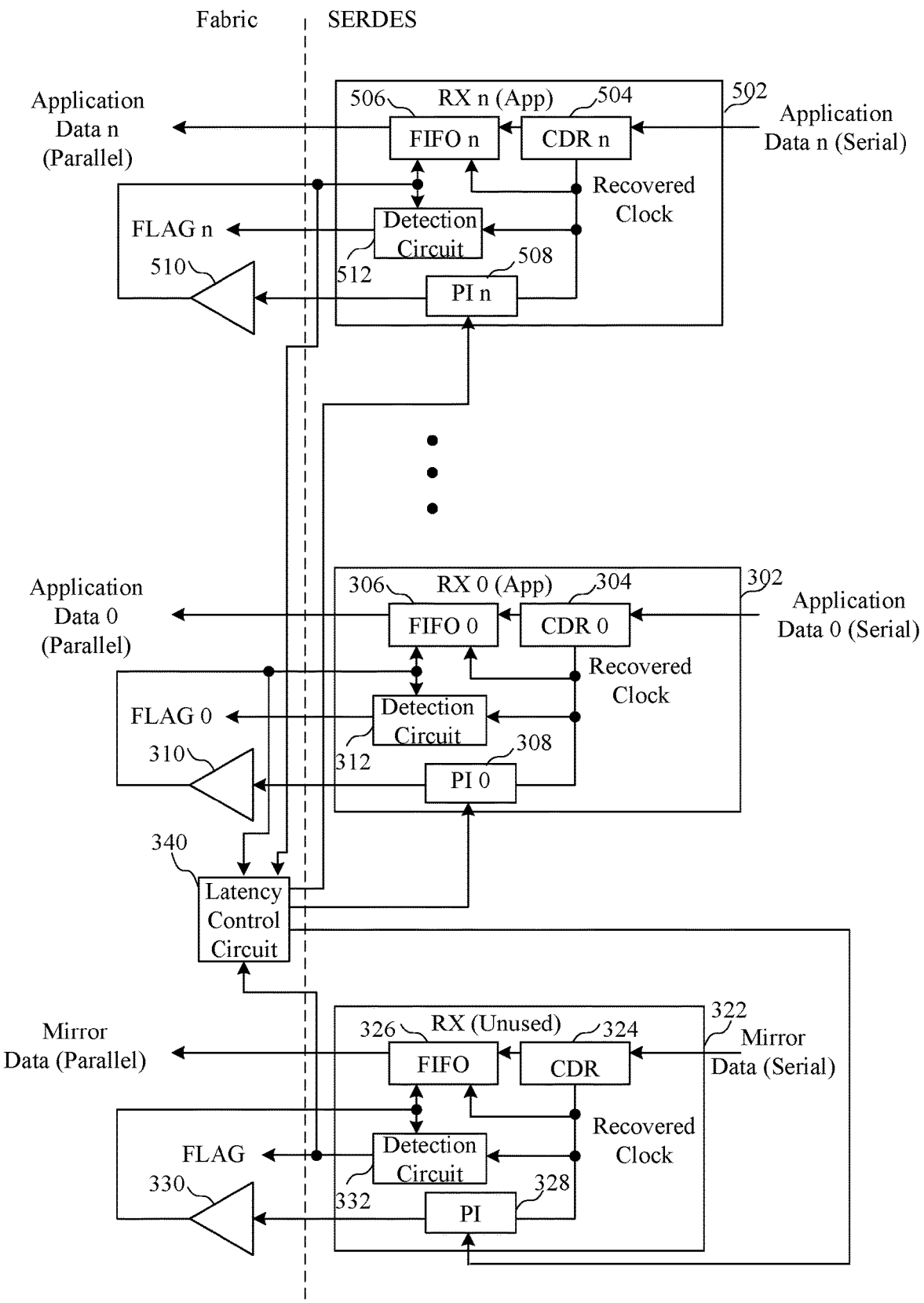
FIG. 5 is a block diagram of a circuit for receiving multiple data streams in an integrated circuit device.
Figure 6:
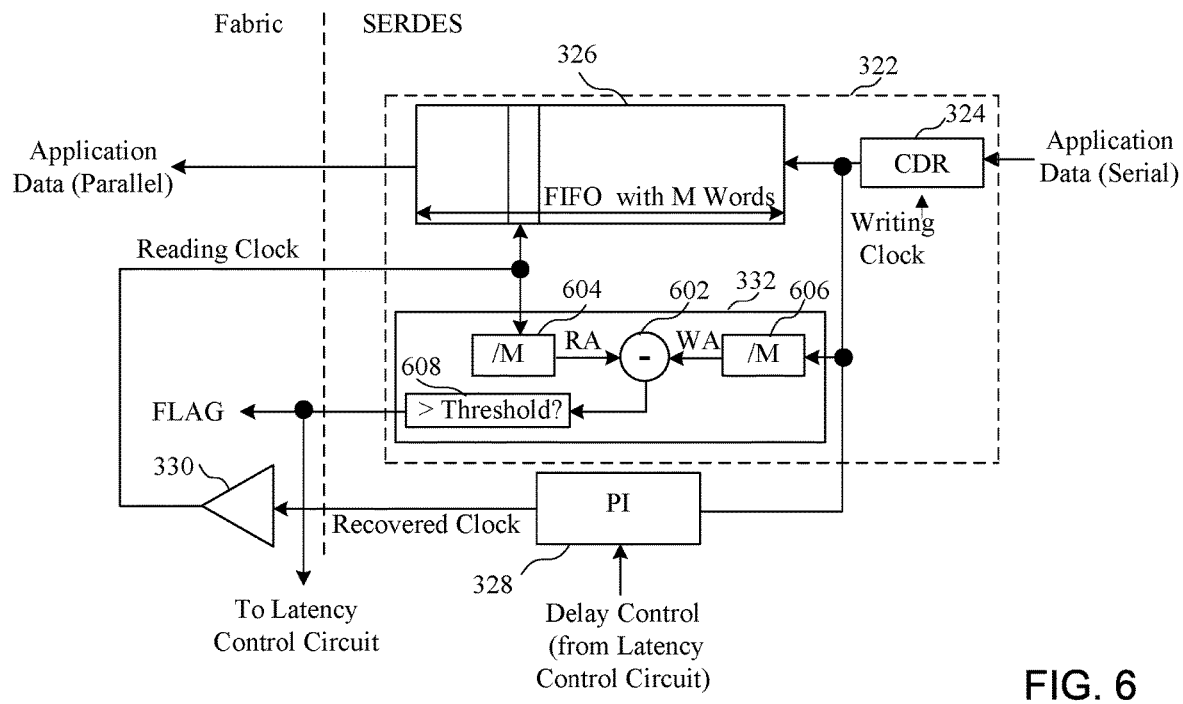
FIG. 6 is a block diagram of a circuit having a phase interpolator and a detection circuit for detecting latency in a received signal.
Figure 7:
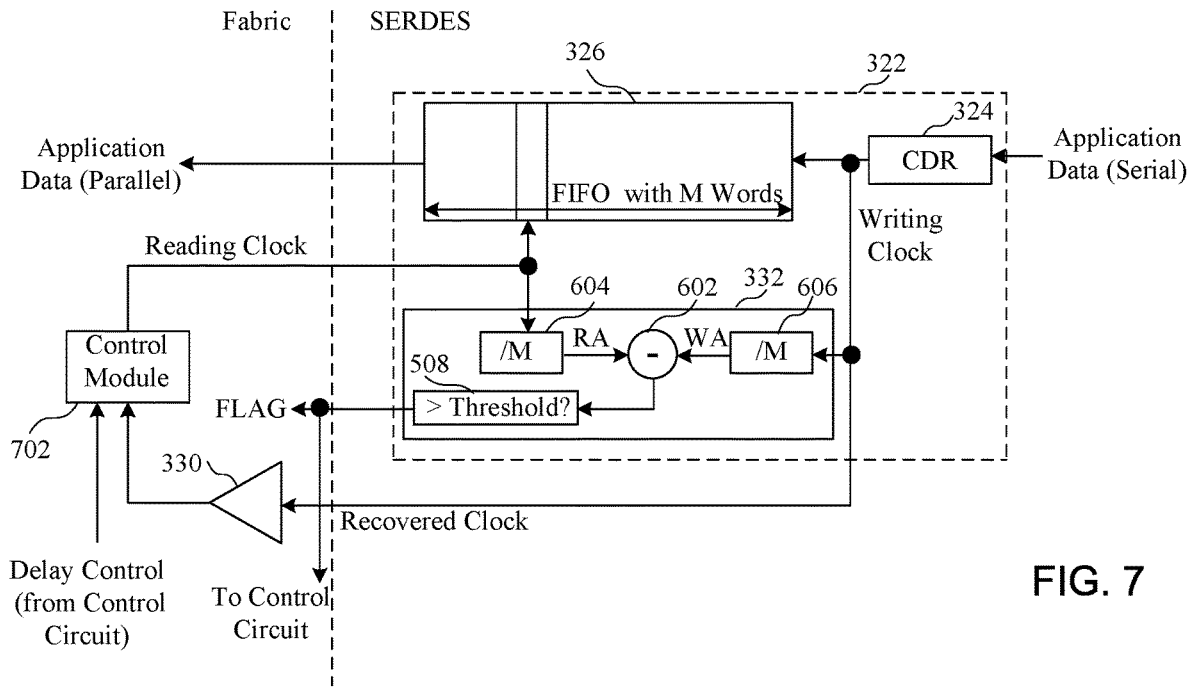
FIG. 7 is a block diagram of a circuit having a detection circuit for detecting latency in a received signal and a delay element in fabric of the integrated circuit device.

According to the implementation of FIG. 3, the latency mirror circuit 322 is an unused receiver circuit. However, it should be understood that the latency mirror circuit could be a transmitter as described in reference to FIG. 2 for example, or any other circuit that can be used to mirror the latency in the receiver circuit. The circuit arrangement of FIGS. 2 and 3, as well as the implementations set forth below in FIGS. 5-7, provides improved performance compared to conventional devices. According to some conventional implementations, the latency could be determined based upon data received in a receiver, where the RX FIFO is removed from the data path and a complex clocking structure (for example, continuously modulating a delay aligner) is used to avoid timing issues when moving the data, such as from fabric of a programmable logic device (which will be described in more detail below) to the serdes. In such an arrangement, the RX latency is known upfront and does not change over time. However, such an arrangement requires a complex and proprietary clocking structure. According to other implementations, a direct measurement of the latency may be made with extra hardware in the receiver. By requiring extra hardware in the receivers, the implementations requiring a direct measurement cannot be applied to receivers that may be available in the integrated circuit and otherwise used without modification. Such a solution may also require the availability of an extra clock, which must operate asynchronous to the clocks in the receiver.

Figure 4:
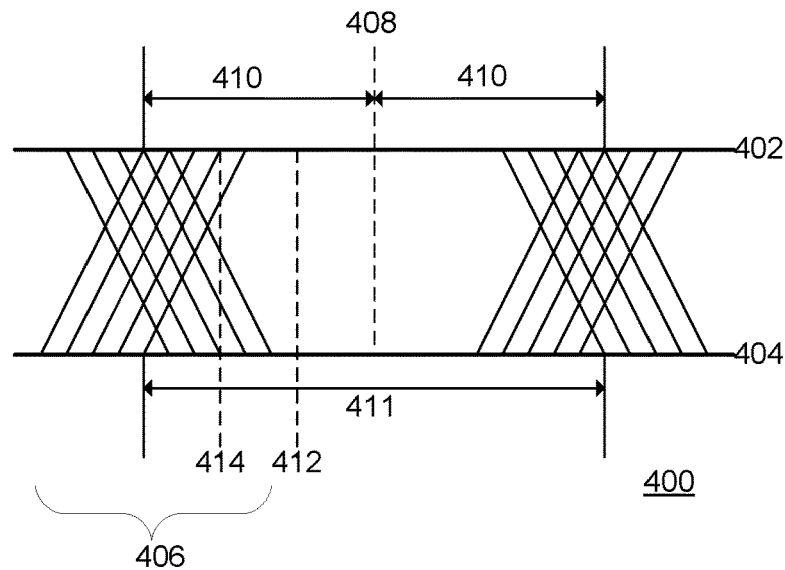
FIG. 4 is an eye diagram of a received signal.

Turning now to FIG. 4, an eye diagram of a received signal is shown. FIG. 4 illustrates an example of an eye diagram for an eye 400. In digital systems, the eye 400 is defined by high voltage level 402 and low voltage level 404, and the edges of the eye 400 are defined by the transitions 406 of the incoming data (with jitter). During operation, a sample selector selects a sample at the center of the eye, represented by line 408, which is separated from the position of the edges (transitions 406) by margin 410, for a total interval unit (IU) 411. As long as the sample selector selects samples near the center of the eye (e.g., near line 408 in the example of the eye 400), the sampled data will be free of bit errors. However, if samples are taken closer to the edges of the eye 400 (e.g., near transitions 406), bit errors may be experienced. The amount of bit errors may increase the further the sample is from the center line 408, due to the jitter of the incoming data.

If a phase shift module shifts the sampling phase horizontally to near line 412, no bit errors will be detected by the detector despite the sampling phase being away from the line 408. This is because the sampling phase at the line 412 is still not near the transitions 406. However, if the phase shift module shifts the sampling phase to line 414, for example, bit errors will be detected by the detector, due to the sampling phase at the line 414 being within the range of transitions 406. By using a delay element such as a phase interpolator, it is possible to detect latency variations, such as latency variation due to a portion of an IU, as will be described in more detail below.

Turning now to FIG. 5, a block diagram of a circuit for receiving multiple data streams in an integrated circuit device is shown. As set forth above, variations in latency as a result of variation in voltage or temperature detected by one receiver can be used to control signals, such as clock signals, used by other receivers. As shown in FIG. 5, a second receiver 502 adapted to receive second application data comprises a CDR circuit 504, and output of which is coupled to a memory element 506, shown here by way of example as a FIFO memory element, and a delay element 508, shown here by way of example as a PI. In addition to the application data that is provided to the memory element 506, a recovered clock signal is coupled to the delay element 508. While the delay element 508 may comprise a series of delay elements that can be controlled to implement a desired delay, a phase interpolator may be less susceptible to variations in voltage and temperature of the integrated circuit device. The delay element is also used to control a clock signal to the memory element 508 to adjust for a detected latency in the receiver circuit. An output of the delay element is provided to a buffer 510, an output of which is provided to the memory element 506 and a detection circuit 512. It should be noted that receiver 502 is the nth receiver, and the latency control circuit 340 could control any number of receivers, where the different receivers may receive application data using different clock signals having different frequencies. Accordingly, only one additional circuit (i.e the latency mirror circuit), which may be any available receiver or transmitter or any other circuit that can mirror the latency in the receiver, can be used to determine variations in latency, such as latency variations due to changes in temperature or voltage of the integrated circuit over time, in real time during the operation of the integrated circuit.

Turning now to FIG. 6, a block diagram of a circuit having a phase interpolator and a detection circuit for detecting latency in a received signal is shown. While the receiver of FIG. 6 is shown by way of example as latency mirror circuit 322, it should be understood that the circuits for determining the fill level of a FIFO and generating a flag that could be used to determine a variation from a desired fill level to enable adjusting a phase of a clock signal (used by the receiver to account for a latency of the receiver, and more particularly a variation in latency of a receiver) could be employed in other receivers. The memory element in FIG. 6 is a FIFO memory, shown here by way of example as an M word FIFO. While the delay element 308 may be implemented as a phase interpolator by way of example, it should be understood that any other delay elements could be used that would be used to control a phase of a clock signal used by the FIFO memory.

The detection circuit 312 may comprise a circuit enabling the comparison of a read address and a write address for determining a fill level of a FIFO memory, and therefore determine a latency of a receiver that is implemented for determining the latency in other receivers of the integrated circuit device. Because that determined latency would correspond to the latency of all receivers, the determined latency could be used to compensate for latency in a receiver using application data, such as by controlling a clock of a memory of the receiver. According to one implementation, the detection circuit 332 may comprise a subtractor circuit 602 configured to receive a read address (RA) and a write address (WA) to determine the fill level of the memory. For example, a divide circuit 604 may be configured to receive a reading clock which is divided by M to generate the RA, and a divide circuit 606 may be configured to receive a writing clock which is divided by M to generate the WA. A comparator 608 may be used to determine whether a difference between the RA and WA exceeds a threshold to generate a flag that is provided to the latency control circuit 340. A delay control signal may be provided from the latency control circuit 340 to control a phase of the reading clock generated by the phase interpolator 308 for the receiver 302 based upon the flag generated by the latency mirror circuit 322.

By way of example, the phase of the reading clock may be set so that fill level of the FIFO is approximately half full. However, as the temperature or voltage of the integrated circuit device changes over time, the latency in the receiver may change. The flag could be used to indicate that the phase of the reading clock needs to be changed to compensate for a variation in latency during operation of the integrated circuit device. According to some implementations, the time of the latency can be determined, for example in terms of picoseconds, and that the control of receiver receiving application data can be adjusted based upon the determined time value. For example, one step of a phase interpolator may achieve a 1 picosecond shift of the phase. If it is determined based upon the fill level (of the receiver used for determining latency) that a phase of the clock signal needs to be selected to compensate for a 10 picosecond latency, the control signal sent to the receiver that is receiving the application data (e.g. receiver 302) will adjust the phase of the reading clock signal to compensate for a 10 picosecond latency. The residual error from the latency measurement is defined by the resolution of the phase interpolator, which may be in range from 1 to a few picoseconds. By using a phase interpolator to vary the phase of the reading clock and detecting the flag, it is possible to achieve sub-UI measurements for receiver latency. It should be noted that the adjustment of the phase for different receivers may vary depending for example on the frequency of the clock signal to the receiver. Because different clock signals may be used for different receivers, the actual phase shift to account for the determined latency variation may be different for different receivers.

Turning now to FIG. 7, a block diagram of a circuit having a detection circuit for detecting latency in a received signal and a delay element in fabric of the integrated circuit is shown. According to the receiver of FIG. 7, the delay element for generating the reading clock (shown here by way of example as a control module 702) may be implanted in fabric of an integrated circuit device, such as programmable logic device. As will be described in more detail below, some integrated circuit devices may comprise programmable resources, including configurable logic elements and programmable interconnect for implementing circuit designs of a user of the integrated circuit device as will be described in more detail in reference to FIGS. 8 and 9. Rather than implementing a phase interpolator as a part of the serdes, a control module 702 may be implemented in the fabric to generate the reading clock for the memory element 306. According to some implementations, the control module 702 may be a clock manager for example. According to other implementations, the control module 702 may comprise a phase interpolator or some other delay element.

Figure 8:
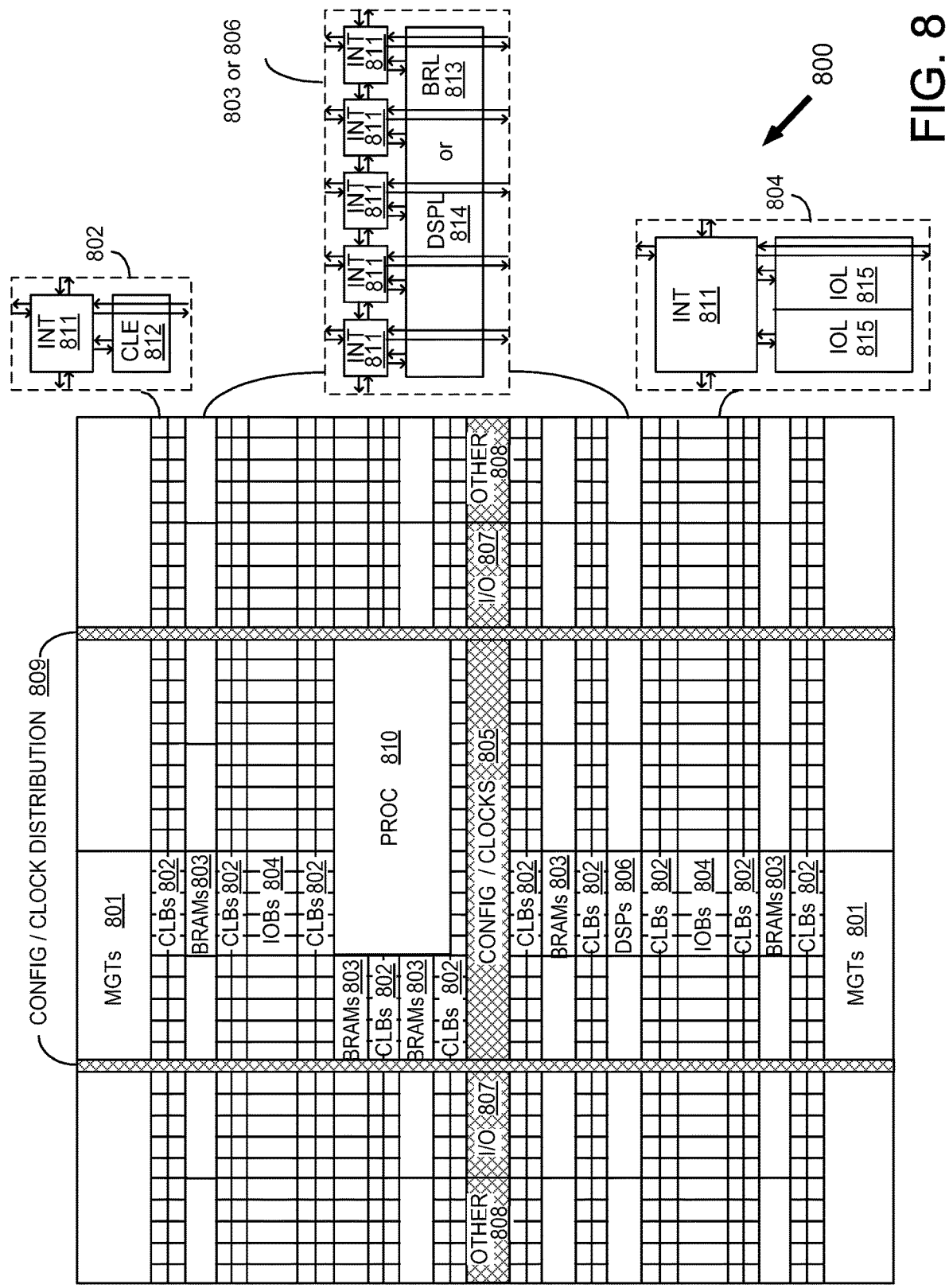
FIG. 8 is a block diagram of an integrated circuit device having programmable resources.

Turning now to FIG. 8, a block diagram of an integrated circuit device having programmable resources is shown, where the integrated circuit device of FIG. 8 may be used to provide a hardened sedies block and fabric to implement the circuits of FIGS. 6 and 7 for example. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 8 comprises an FPGA architecture 800 having a large number of different programmable tiles including multi-gigabit transceivers (MGTs) 801, CLBs 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807 (e.g., configuration ports and clock ports), and other programmable logic 808 such as digital clock managers, analog-to-digital converters, system monitoring logic, and so forth. Some FPGAs also include dedicated processor blocks (PROC) 810, which may be used to implement a software application, for example.

In some FPGAs, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 may include a configurable logic element (CLE) 812 that may be programmed to implement user logic plus a single programmable interconnect element 811. A BRAM 803 may include a BRAM logic element (BRL) 813 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 806 may include a DSP logic element (DSPL) 814 in addition to an appropriate number of programmable interconnect elements. An 10B 804 may include, for example, two instances of an input/output logic element (IOL) 815 in addition to one instance of the programmable interconnect element 811. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear in order to facilitate the efficient implementation of user logic. While the implementation of FIG. 8 relates to an integrated circuit having programmable resources, it should be understood that the circuits and methods set forth above could be implemented in any type of device having a combination of programmable resources and hard blocks.

Figure 9:
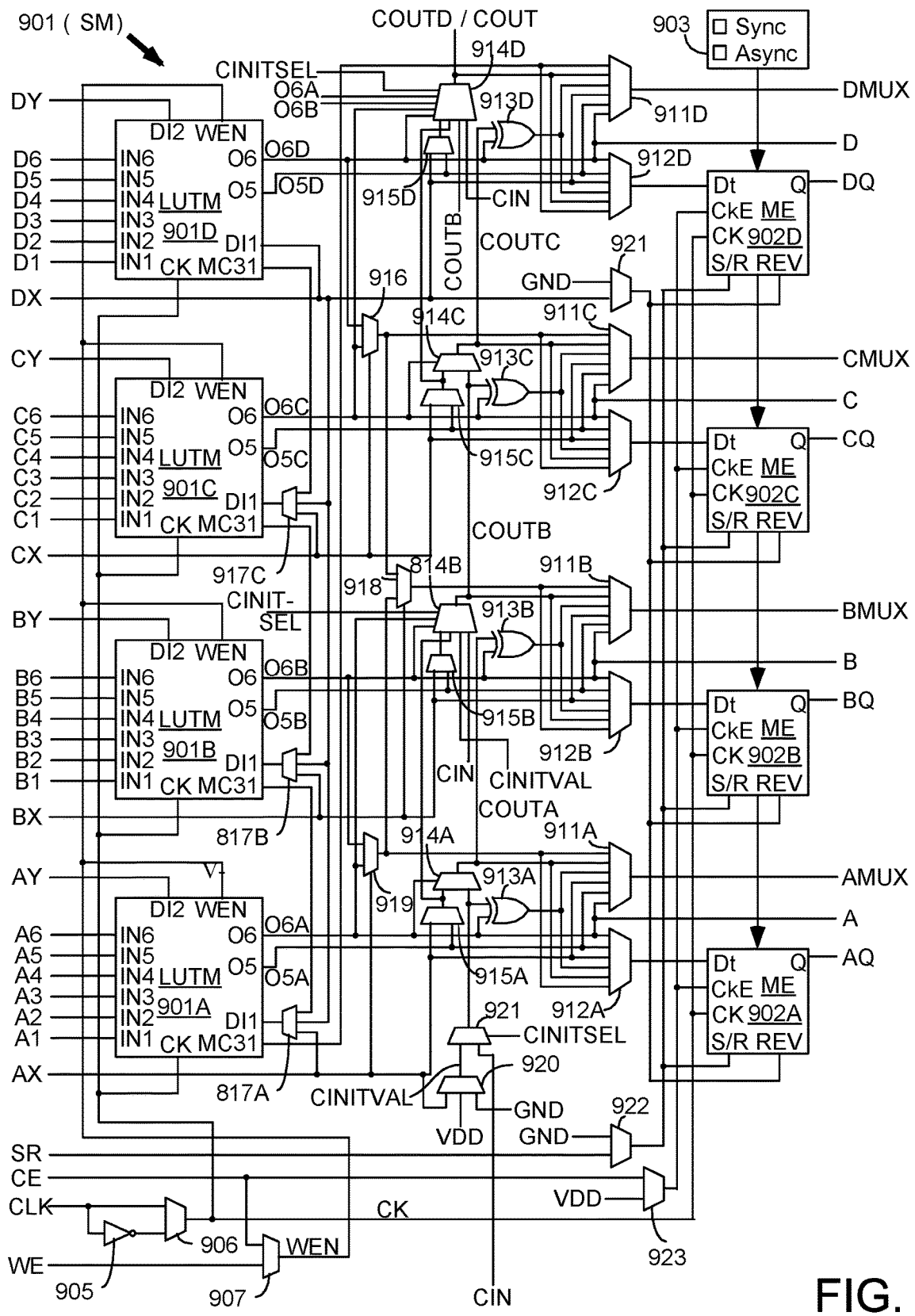
FIG. 9 is a block diagram of a configurable logic element of the integrated circuit device of FIG. 8.

Turning now to FIG. 9, a block diagram of a configurable logic element of the integrated circuit device of FIG. 8 is shown. Turning now to FIG. 9, a block diagram of a configurable logic element that could be implemented in FIG. 8 is shown. In particular, FIG. 9 illustrates in simplified form a configurable logic element, which is an example of Programmable Logic, of a configuration logic block 802 of FIG. 8. In the implementation of FIG. 9, slice M 901 includes four lookup tables (LUTMs) 901A-901D, each driven by six LUT data input terminals A1-A6, B1-B6, C1-C6, and D1-D6 and each providing two LUT output signals O5 and O6. The O6 output terminals from LUTs 901A-901D drive slice output terminals A-D, respectively. The LUT data input signals are supplied by the FPGA interconnect structure via input multiplexers, which may be implemented by programmable interconnect element 911, and the LUT output signals are also supplied to the interconnect structure. Slice M also includes: output select multiplexers 911A-911D driving output terminals AMUX-DMUX; multiplexers 912A-912D driving the data input terminals of memory elements 902A-902D; combinational multiplexers 916, 918, and 919; bounce multiplexer circuits 922-923; a circuit represented by inverter 905 and multiplexer 906 (which together provide an optional inversion on the input clock path); and carry logic having multiplexers 914A-914D, 915A-915D, 920-921 and exclusive OR gates 913A-913D. All of these elements are coupled together as shown in FIG. 9. Where select inputs are not shown for the multiplexers illustrated in FIG. 9, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 9 for clarity, as well as from other selected figures herein.

In the pictured implementation, each memory element 902A-902D may be programmed to function as a synchronous or asynchronous flip-flop or latch. The selection between synchronous and asynchronous functionality is made for all four memory elements in a slice by programming Sync/Asynch selection circuit 903. When a memory element is programmed so that the S/R (set/reset) input signal provides a set function, the REV input terminal provides the reset function. When the memory element is programmed so that the S/R input signal provides a reset function, the REV input terminal provides the set function. Memory elements 902A-902D are clocked by a clock signal CK, which may be provided by a global clock network or by the interconnect structure, for example. Such programmable memory elements are well known in the art of FPGA design. Each memory element 902A-902D provides a registered output signal AQ-DQ to the interconnect structure. Because each LUT 901A-901D provides two output signals, O5 and O6, the LUT may be configured to function as two 5-input LUTs with five shared input signals (IN1-IN5), or as one 6-input LUT having input signals IN1-IN6.

In the implementation of FIG. 9, each LUTM 901A-901D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 917A-

917C for LUTs 901A-901C), or to the two 32-bit RAMs via input terminals DI1 and DI2. RAM write operations in the LUT RAMs are controlled by clock signal CK from multiplexer 906 and by write enable signal WEN from multiplexer 907, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 901A may also be provided to the general interconnect structure for shift register chaining, via output select multiplexer 911D and CLE output terminal DMUX. Accordingly, the circuits and methods set forth above may be implemented in a device such as the devices of FIGS. 8 and 9, or any other suitable device. While a PLD such as the FPGA of FIGS. 8 and 9 are shown by way of example, the circuits and methods of storing data, including designing circuits by selecting asymmetrical or symmetrical memory elements from a Cell Library, can be implemented for any type of integrated circuit, including an application specific integrated circuit (ASIC).

Figure 10:
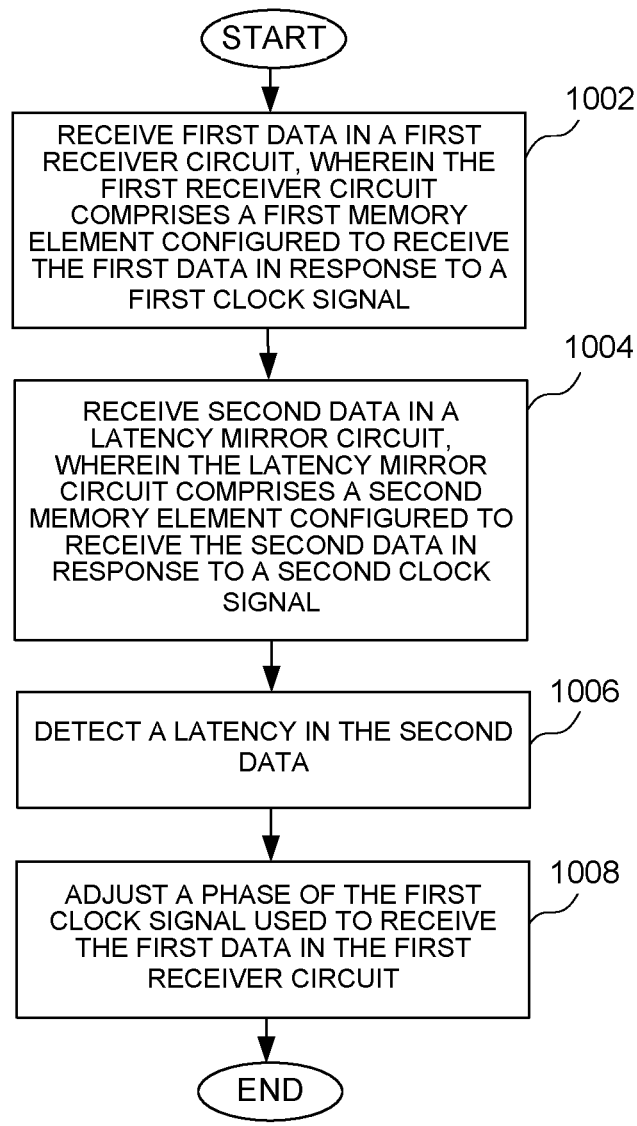
FIG. 10 is a flow diagram showing a method of receiving data in an integrated circuit device.

Turning now to FIG. 10 is a flow diagram showing a method of receiving data in an integrated circuit device. First data is received in a first receiver circuit, wherein the first receiver circuit comprises a first memory element configured to receive the first data in response to a first clock signal at a block 1002. Second data is received in a latency mirror circuit, wherein the latency mirror circuit comprises a second memory element configured to receive the second data in response to a second clock signal at a block 1004. According to one implementation, the first receiver could be receiver 302 and the latency mirror circuit could be latency mirror circuit 322, respectively. A latency detected in the second data at a block 1006. The latency could be determined by a latency control circuit, such as latency control circuit 340, in response to a signal from a detection circuit, such as detection circuit 312 for example. A phase of the first clock signal used to receive the first data in the first receiver circuit is adjusted at a block 1008. The phase may be adjusted using a phase interpolator, as described above.

According to some implementations, the first data may comprise application data and the second data comprises arbitrary data. The first receiver circuit may comprise a first phase interpolator, and the latency control circuit controls a phase of a clock signal for reading data from the first memory element. The latency mirror circuit may comprise a detection circuit configured to receive a writing clock and a reading clock for the memory element, wherein the detection circuit indicates whether a difference between the writing clock and the reading clock exceeds a threshold. The second memory element may comprise a FIFO memory, and the detection circuit generates a flag based upon a fill level of the second memory element. The latency control signal may generate a latency control signal in response to the flag generated based upon the fill level of the second memory element, and may enable detecting a latency in the second data that is less than one unit interval. According to some implementations, the first clock signal is different than second clock signal. The method may further comprise receiving third data, wherein the third receiver circuit comprises a third memory element configured to receive the third data in response to a third clock signal and the latency control circuit adjusts a phase of the third clock signal used to receive the third data in the third receiver circuit. The second receiver may comprise a transmitter of a transceiver having the first receiver.

The method of FIG. 10 may be implemented using the circuits of FIGS. 1-9 as described, or using some other suitable circuits. While specific elements of the method are described, it should be understood that additional elements of the method, or additional details related to the elements, could be implemented according to the disclosure of FIGS. 1-9.

It can therefore be appreciated that new circuits for and methods of implementing a receiver in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A receiver implemented in an integrated circuit device, the receiver comprising:
 a first receiver circuit configured to receive first data at a first receiver input, wherein the first receiver circuit comprises a first memory element configured to receive the first data in response to a first clock signal; and
 a latency mirror circuit configured to receive second data at a second receiver input, wherein the latency mirror circuit comprises a second memory element configured to receive the second data in response to a second clock signal; and
 a latency control circuit configured to detect a latency in the second data, wherein the latency control circuit adjusts a phase of the first clock signal used to receive the first data in the first receiver circuit.

2. The receiver of claim 1, wherein the first data comprises application data and the second data comprises arbitrary data.

3. The receiver of claim 1, wherein the first receiver circuit comprises a first phase interpolator, and the latency control circuit controls a phase of a clock signal for reading data from the first memory element.

4. The receiver of claim 3, wherein the latency mirror circuit comprises a detection circuit configured to receive a writing clock and a reading clock for the second memory element, wherein the detection circuit indicates whether a difference between the writing clock and the reading clock exceeds a threshold.

5. The receiver of claim 4, wherein the second memory element comprises a FIFO memory, and the detection circuit generates a flag based upon a fill level of the second memory element.

6. The receiver of claim 5, wherein the latency control circuit generates a latency control signal in response to the flag generated based upon the fill level of the second memory element.

7. The receiver of claim 1, wherein the latency control circuit enables detecting a latency in the second data that is less than one unit interval.

8. The receiver of claim 1, further comprising a second receiver circuit configured to receive third data, wherein the second receiver circuit comprises a third memory element configured to receive the third data in response to a third clock signal and the latency control circuit adjusts a phase of the third clock signal used to receive the third data in the third receiver circuit.

9. The receiver of claim 1, wherein the latency mirror circuit comprises a receiver circuit.

10. The receiver of claim 1, wherein the latency mirror circuit comprises a transmitter of a transceiver having the first receiver.

11. A method of receiving data in an integrated circuit device, the method comprising:
receiving first data at a first receiver input of a first receiver circuit, wherein the first receiver circuit comprises a first memory element configured to receive the first data in response to a first clock signal; and
receiving second data at a second receiver input of a latency mirror circuit, wherein the latency mirror circuit comprises a second memory element configured to receive the second data in response to a second clock signal;
detecting a latency in the second data; and
adjusting a phase of the first clock signal used to receive the first data in the first receiver circuit.

12. The method of claim 11, wherein the first data comprises application data and the second data comprises arbitrary data.

13. The method of claim 11, wherein the first receiver circuit comprises a first phase interpolator, and the latency control circuit controls a phase of a clock signal for reading data from the first memory element.

14. The method of claim 13, wherein the latency mirror circuit comprises a detection circuit configured to receive a writing clock and a reading clock for the second memory element, wherein the detection circuit indicates whether a difference between the writing clock and the reading clock exceeds a threshold.

15. The method of claim 14, wherein the second memory element comprises a FIFO memory, and the detection circuit generates a flag based upon a fill level of the second memory element.

16. The method of claim 15, wherein the latency control circuit generates a latency control signal in response to the flag generated based upon the fill level of the second memory element.

17. The method of claim 11, wherein the latency control circuit enables detecting a latency in the second data that is less than one unit interval.

18. The method of claim 11, further comprising receiving third data at a second receiver circuit, wherein the second receiver circuit comprises a third memory element configured to receive the third data in response to a third clock signal and the latency control circuit adjusts a phase of the third clock signal used to receive the third data in the third receiver circuit.

19. The method of claim 11, wherein the latency mirror circuit comprises a receiver.

20. The method of claim 11, wherein the latency mirror circuit comprises a transmitter of a transceiver having the first receiver.

* * * * *